United States Patent [19]
Waki et al.

[11] Patent Number: 5,479,051
[45] Date of Patent: Dec. 26, 1995

[54] SEMICONDUCTOR DEVICE HAVING A PLURALITY OF SEMICONDUCTOR CHIPS

[75] Inventors: Masaki Waki, Kagoshima; Tosiyuki Honda; Yukio Gomi, both of Kawasaki, all of Japan

[73] Assignees: Fujitsu Limited, Kawasaki; Kyushu Fujitsu Electronics Limited, Satsuma, both of Japan

[21] Appl. No.: 125,844

[22] Filed: Sep. 24, 1993

[30] Foreign Application Priority Data

Oct. 9, 1992 [JP] Japan ................................ 4-272009

[51] Int. Cl.⁶ ............................ H01L 23/16; H01L 23/28
[52] U.S. Cl. ...................... 257/724; 257/667; 257/725; 257/787
[58] Field of Search .................... 257/667, 723, 257/724, 725, 777, 787, 790

[56] References Cited

U.S. PATENT DOCUMENTS

| | | | |
|---|---|---|---|
| 4,160,308 | 7/1979 | Courtney et al. | 257/724 |
| 4,437,235 | 3/1984 | McIver | 257/725 |
| 4,712,017 | 12/1987 | Kamasaki | 257/724 |
| 4,745,294 | 5/1988 | Kohashi et al. | 257/724 |
| 4,763,188 | 8/1988 | Johnson | 257/777 |
| 4,862,322 | 8/1989 | Bickford et al. | 257/723 |
| 5,057,457 | 10/1991 | Miyahara et al. | 257/790 |
| 5,101,324 | 3/1992 | Sato | 257/787 |
| 5,296,737 | 3/1994 | Nishimura et al. | 257/723 |
| 5,331,235 | 7/1994 | Chun | 257/777 |
| 5,332,922 | 7/1994 | Oguchi et al. | 257/723 |
| 5,347,429 | 9/1994 | Kohno et al. | 257/777 |

FOREIGN PATENT DOCUMENTS

| | | | |
|---|---|---|---|
| 0159361 | 9/1983 | Japan | 257/777 |
| 0222552 | 12/1983 | Japan | 257/725 |
| 0209148 | 12/1983 | Japan | 257/725 |
| 0095958 | 5/1985 | Japan | 257/777 |
| 0204635 | 8/1988 | Japan | 257/725 |
| 0109760 | 5/1991 | Japan | 257/777 |
| 0048767 | 2/1992 | Japan | 257/725 |

*Primary Examiner*—Rolf Hille
*Assistant Examiner*—David Ostrowski
*Attorney, Agent, or Firm*—Staas & Halsey

[57] ABSTRACT

A semiconductor device includes at least a first semiconductor chip and a second semiconductor chip each having a first surface and a second surface. The second surface of the first semiconductor chip confronts the first surface of the second semiconductor chip. Additionally, the semiconductor device includes a plurality of leads having inner portions and outer portions, where the inner portions of the leads are electrically coupled to selected portions on one of the first and second surfaces of each of the first and second semiconductor chips. An insulator is interposed between the second surface of the first semiconductor chip and the first surface of the second semiconductor chip at portions other than the selected portions. Further, a resin package encapsulates the first and second semiconductor chips so that the outer portions of the leads project outside the resin package.

17 Claims, 13 Drawing Sheets

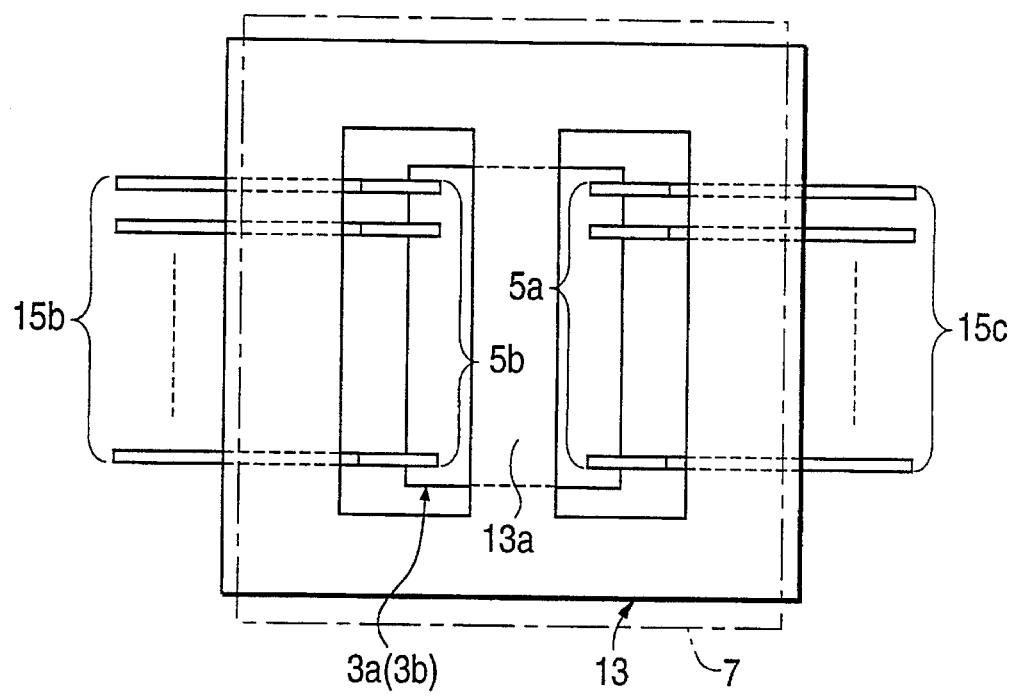

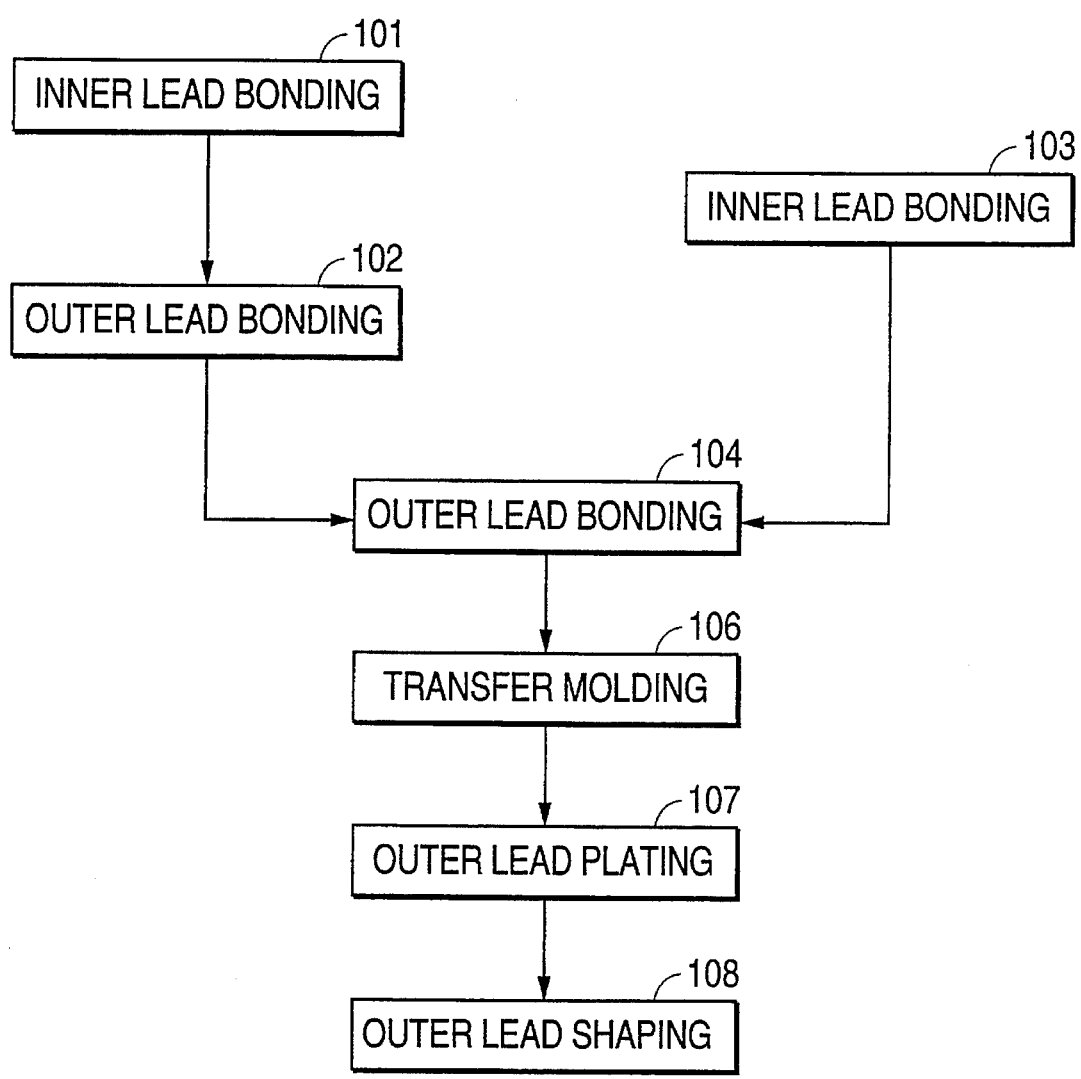

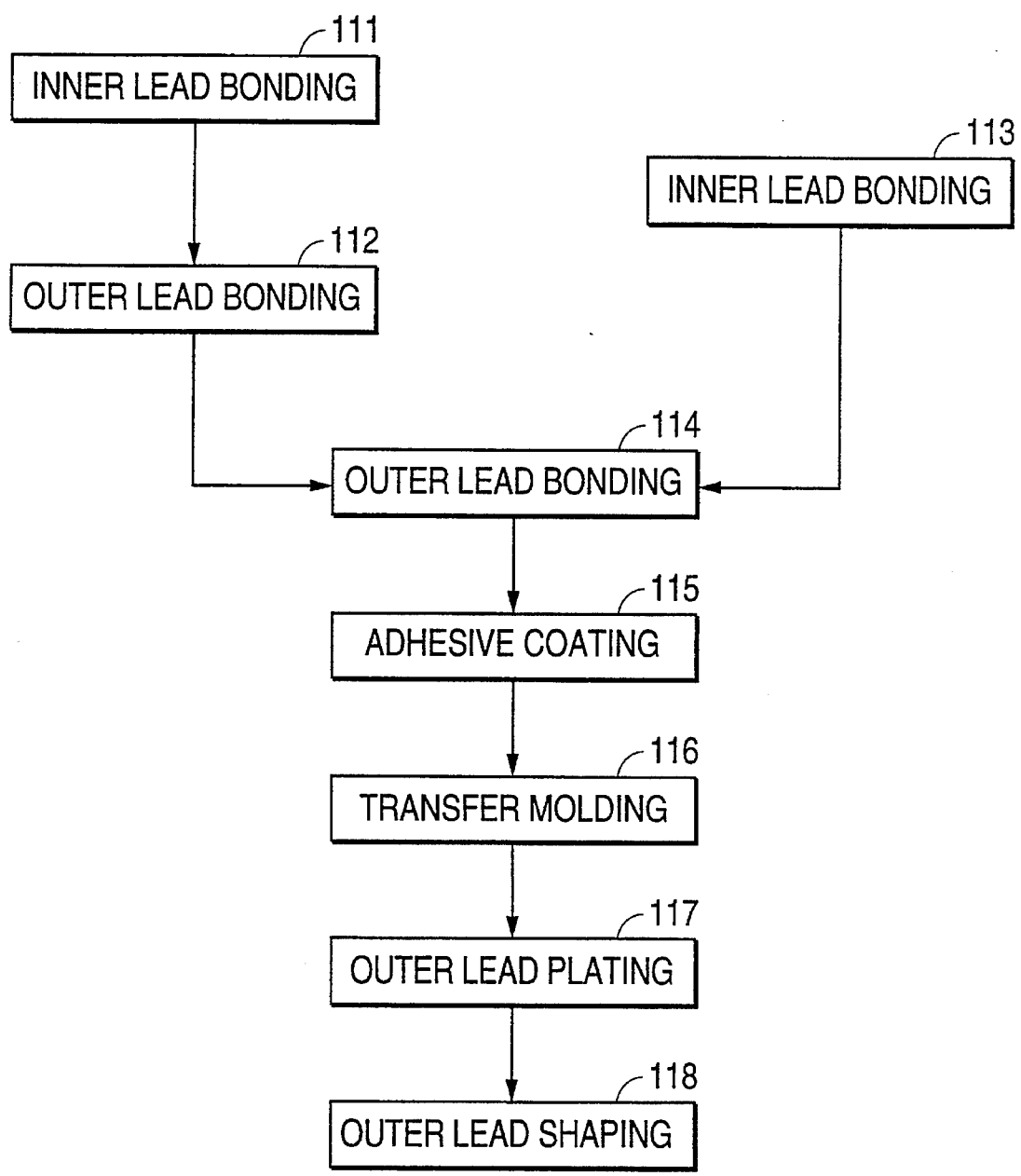

SEMICONDUCTOR DEVICE HAVING A PLURALITY OF SEMICONDUCTOR CHIPS

BACKGROUND OF THE INVENTION

The present invention generally relates to semiconductor devices, and more particularly to a semiconductor device which has a plurality of semiconductor chips.

To satisfy demands to reduce the size of electronic equipments and the like, a semiconductor device having the a chip-on-chip structure has been proposed. The semiconductor device having the chip-on-chip structure has a plurality of semiconductor chips mounted within a single package. However, to reduce the size and weight of the semiconductor device, it is necessary to reduce the thickness of the package. When the thickness of the semiconductor device is reduced, it is necessary to carry out a resin molding without displacing the semiconductor chip mounted within the package.

FIG.1 shows an example of a conventional semiconductor device. In FIG. 1, a semiconductor device 1 has a plurality of semiconductor chips, more specifically, first and second semiconductor chips 3a and 3b. The first semiconductor chip 3a is provided at a central opening of a lead frame 2 so that a first surface 3a' having circuits formed thereon faces up. Similarly, the second semiconductor chip 3b is provided at the central opening of the lead frame 2 so that a first surface 3b' having circuits formed thereon faces up. An inner lead bonding is made so that the first semiconductor chip 3a is connected to bumps 4 at respective ends of tape leads 5a and 5b which are bent as shown. In addition, an inner lead bonding is made so that the second semiconductor chip 3b is connected to bumps 4 at respective ends of tape leads 5c and 5d.

The tape leads 5a and 5b are bent so that a second surface 3a" of the first semiconductor chip 3a confronts and is approximately parallel to the first surface 3b' of the second semiconductor chip 3b. An outer lead bonding is made so that other ends of the tape leads 5a, 5b, 5c and 5d are connected to outer leads 6 of the lead frame 2 by thermocompression bonding. In addition, a transfer molding is carried out to make a package which is made of a mold resin 7. For example, when surface mounting the semiconductor device 1 on a circuit substrate, the outer leads 6 are bent into an L-shape or a J-shape.

A semiconductor device exists which has the first semiconductor chip 3a arranged so that the second surface 3a" thereof faces up, and the surfaces 3a' of the first semiconductor chip 3a and the surface 3b' of the second semiconductor chip 3b confront each other.

Next, a description will be given of essential steps of a method of producing the semiconductor device 1 shown in FIG. 1, by referring to FIGS. 2A and 2B.

As shown in FIG. 2A, the lead frame 2 and the semiconductor chips 3a and 3b of the semiconductor device 1 are connected to the tape leads 5a, 5b, 5c and 5d, and the semiconductor chips 3a and 3b and their peripheral parts are set within a cavity which is formed by upper and lower dies 8a and 8b. Then, the mold resin 7 is injected via a gate 10, so as to carry out a transfer molding. As shown in FIG. 2A, the semiconductor chips 3a and 3b will not be displaced by the injection pressure of the mold resin 7 at the initial stage of the injection process.

But the semiconductor chip 3a is only supported on the outer leads 6 by the tape leads 5a an 5b. In addition, the tape leads 5a and 5b have a relatively poor rigidity because these tape leads 5a and 5b are made of a polyimide tape which is approximately 125 μm thick and has a copper film pattern having a thickness of approximately 35 μm adhered thereon, for example. Since the tape leads 5a and 5b having this relatively poor rigidity are bent in the shape shown in FIG. 2A, the tape leads 5a and 5b may be deformed by the injection pressure of the mold resin 7 as the injection process progresses, thereby displacing the semiconductor chip 3a.

Similarly, the rigidity of the tape leads 5c and 5d is also relatively poor, and the semiconductor chip 3b may be displaced slightly as the injection process progresses.

Accordingly, the positions of the semiconductor chips 3a and 3b, the viscosity of the mold resin, the injection pressure of the mold resin 7 and the like are controlled so as to prevent the semiconductor chips 3a and 3b from being displaced during the injection process.

However, according to the conventional semiconductor device 1, the tape leads 5a through 5d are deformed as shown in FIG. 2B when the mold resin 7 is injected to a certain extent if the production precision of the tape leads 5a through 5d includes variance, even if the variance in the injection pressure of the mold resin 7 is sufficiently controlled, thereby causing the semiconductor chips 3a and 3b to be displaced. As a result, there are problems in that the second surface 3a" of the semiconductor chip 3a may make contact with the tape lead 5d, and the tape lead 5a may make contact with a top edge portion of the semiconductor chip 3a to cause a short-circuit, as shown in FIG. 2B.

SUMMARY OF THE INVENTION

Accordingly, it is a general object of the present invention to provide a novel and useful semiconductor device in which the problems described above are eliminated.

Another and more specific object of the present invention is to provide a semiconductor device comprising at least a first semiconductor chip and a second semiconductor chip, where each of the first and second semiconductor chips has a first surface and a second surface and the second surface of the first semiconductor chip confronts the first surface of the second semiconductor chip. The semiconductor device additionally comprises a plurality of leads having inner portions and outer portions, where the inner portions of the leads are electrically coupled to predetermined portions on one of the first and second surfaces of each of the first and second semiconductor chips. An insulator is interposed between the second surface of the first semiconductor chip and the first surface of the second semiconductor chip at portions other than the predetermined portions. Further, a resin package encapsulates the first and second semiconductor chips so that the outer portions of the leads project outside the resin package. According to the semiconductor device of the present invention, it is possible to provide two semiconductor chips within a single package of the semiconductor device and improve the chip mounting density, without the possibility of electrically short-circuiting the semiconductor chips and the tape leads.

Still another object of the present invention is to provide a semiconductor device comprising at least a first semiconductor chip and a second semiconductor chip, where each of the first and second semiconductor chips has a first surface and a second surface. The second surface of the first semiconductor chip confronts the first surface of the second semiconductor chip. The semiconductor device additionally comprises a plurality of leads having inner portions and outer portions, where the inner portions of the leads are electrically coupled to predetermined portions on one of the first and second surfaces of each of the first and second semiconductor chips. Further, a resin package encapsulates the first and second semiconductor chips so that the outer portions of the leads project outside the resin package, where the inner portions of the leads are partially interposed between the second surface of the first semiconductor chip and the first surface of the second semiconductor chip so that a predetermined gap is formed between the second surface of the first semiconductor chip and the first surface of the second semiconductor chip. According to the semiconductor device of the present invention, it is possible to provide two semiconductor chips within a single package of the semiconductor device and improve the chip mounting density, without the possibility of electrically short-circuiting the semiconductor chips and the tape leads.

Other objects and further features of the present invention will be apparent from the following detailed description when read in conjunction with the accompanying drawings.

BRIEF DESCRIPTION THE DRAWINGS

FIG. 4 is a plan view showing an essential part of a modification of the first embodiment;

FIG. 8 is a flow chart for explaining a method of producing the second embodiment;

FIG. 14 is a flow chart for explaining a method of producing the modification of the third embodiment.

DESCRIPTION OF THE PREFERRED EMBODIMENTS

Figure 1:
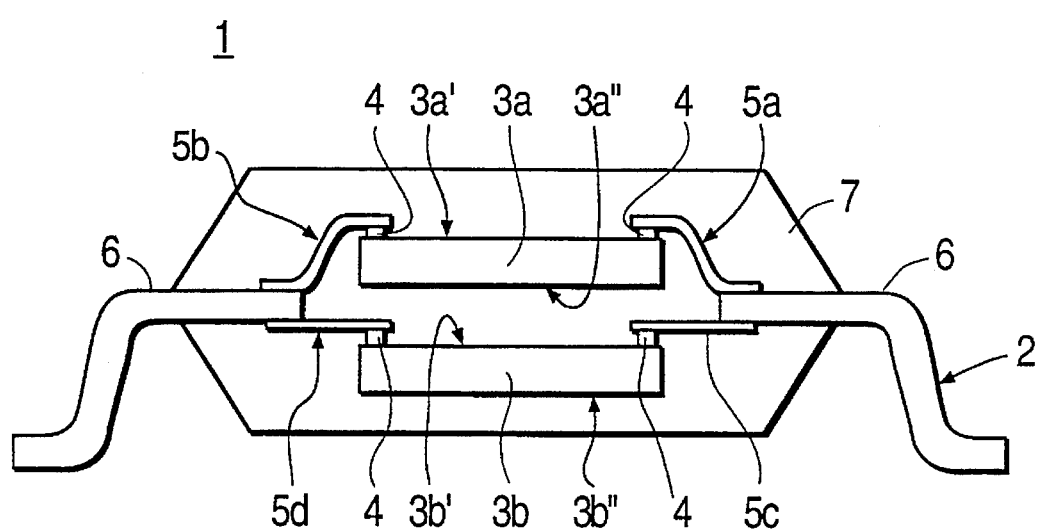
FIG. 1 is a cross sectional view showing an example of a conventional semiconductor device.
Figure 2A:
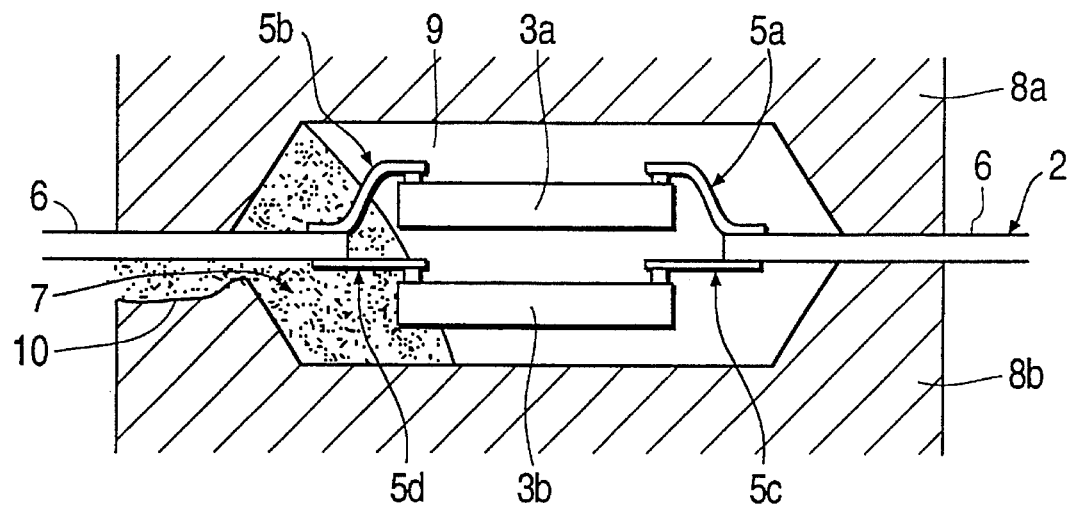
FIGS. 2A and 2B are cross sectional views for explaining a method of producing the conventional semiconductor device shown in FIG. 1.
Figure 2B:
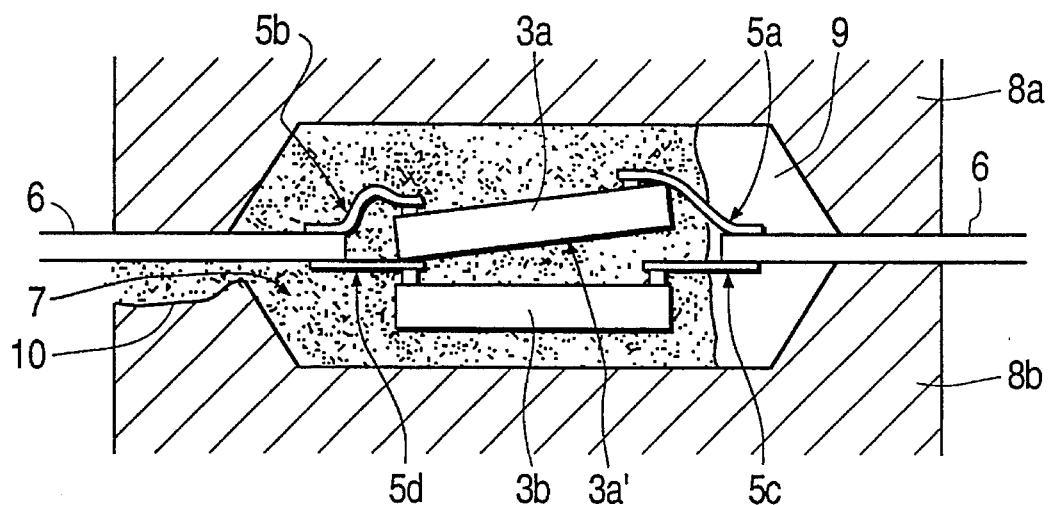
Figure 3A:
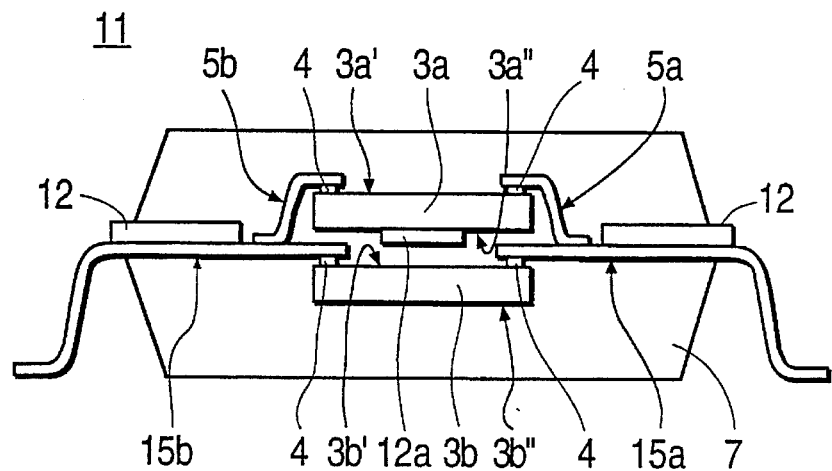
FIGS. 3A and 3B are a cross sectional view and a plan view showing a first embodiment of a semiconductor device according to the present invention.
Figure 3B:
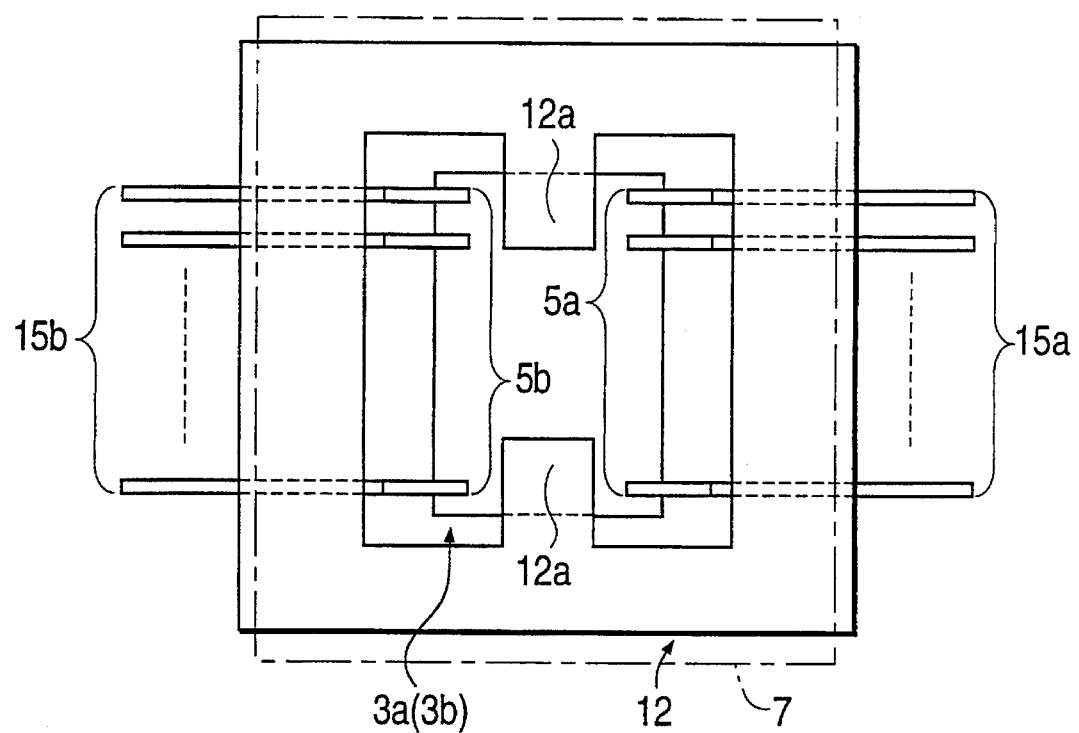

FIG. 3A shows a cross sectional view of a first embodiment of a semiconductor device according to the present invention, and FIG.3B shows a plan view of an essential part of the first embodiment.

In FIG. 3A, a semiconductor device 11 includes a plurality of semiconductor chips, namely, a first semiconductor chip 3a and a second semiconductor chip 3b. In this semiconductor device 11, tape leads 15a and 15b and tape leads 5a and 5b are integrally formed by thermo-compression bonding. For example, the tape leads 15a and 15b are made of a conductive material and gold plated whereas, the tape leads 5a and 5b are tin plated and are bent as shown. The first and second semiconductor chips 3a and 3b are provided at a central opening formed by the tape leads 15a, 15b, 5a and 5b. The first semiconductor chip 3a has a first surface 3a' on which circuits are formed, and this first surface 3a' faces up in FIG. 3A. The second semiconductor chip 3b has a first surface 3b' on which circuits are formed, and this first surface 3b' also faces up in FIG. 3A. The first and second semiconductor chips 3a and 3b respectively are connected to respective ends of the tape leads 5a and 5b and the tape leads 15a and 15b via bumps 4.

A support member 12 which is made of an insulator material is placed on top of the tape leads 15a and 15b. For example, this support member 12 may be formed by an insulative adhesive agent such as a silicon resin, but in this embodiment, the support member 12 is made of a material called CAPTON (registered trademark) which is a kind of polyimide system resin. This support member 12 has a frame shape as shown in FIG. 3B, and has two projecting parts 12a which project to the inside of the support member 12.

A second surface 3a" of the first semiconductor chip 3a makes contact with the top surface of the projecting parts 12a of the support member 12. In addition, the tape leads 5a and 5b are bent so that the second surface 3a" of the first semiconductor chip 3a confronts the first surface 3b' of the second semiconductor chip 3b with a gap formed therebetween and the second surface 3a" is approximately parallel to the first surface 3b'.

A mold resin 7 forms a package which encapsulates the first and second semiconductor chips 3a and 3b and the peripheral parts thereof, and this package is formed by a transfer molding. As a result, the other ends of the tape leads 15a and 15b project from the package and are bent into an L-shape or a J-shape, for example.

FIG. 4 shows a plan view of an essential part of a modification of the first embodiment. In FIG. 4, those parts which are the same as those corresponding parts in FIGS. 3A and 3B are designated by the same reference numerals, and a description thereof will be omitted.

In this modification shown in FIG. 4, a support member 13 is used in place of the support member 12. This support member 13 is also made of an insulator material such as CAPTON, and has a bridge part 13a which substantially corresponds to the two projecting parts 12a of the support part 12 which are connected. Similar to the first embodiment, the second surface 3a" of the first semiconductor chip 3a makes contact with the top surface of the support member 13.

Conventionally, a support ring was placed on top of the tape leads to restrict the positions of the tape leads so that the tip end portions of the tape leads make contact with predetermined bonding pads of the semiconductor chip, for example. But according to the first embodiment and its modification, the support members 12 and 13 make contact wit the second surface 3a" of the first semiconductor chip 3a to hold and support the first semiconductor chip 3a, in addition to restricting the positions of the tape leads 15a and 15b.

A general description will now be given of a method for producing the semiconductor device 11 shown in FIGS. 3A and 3B or the semiconductor device shown in FIG. 4, by referring to FIGS. 5A through 5D. The method shown in FIGS. 5A through 5D employs the so-called tape automated bonding (TAB) inner lead bonding.

Figure 5A:
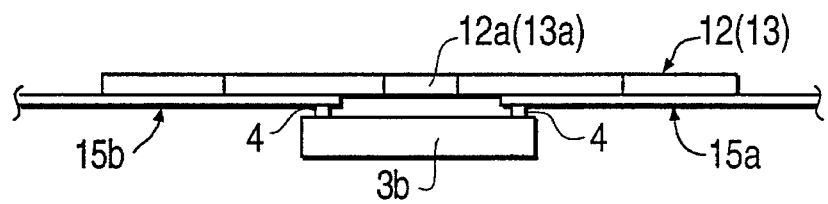
FIGS. 5A through 5D are cross sectional views for explaining a method of producing the first embodiment.

As shown in FIG. 5A, the support member 12 or 13 is placed on the top surfaces of the tape leads 15a and 15b, and the tip end portions of the tape leads 15a and 15b are connected to predetermined electrodes (not shown) of the second semiconductor chip 3b via the bumps 4. In this state, the projecting parts 12a of the support member 12 or the bridge 13a of the support member 13 is positioned at the center portion of the central opening.

Figure 5B:
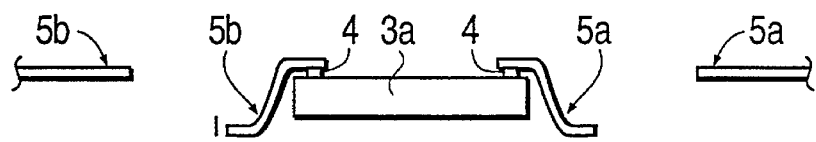

Next, as shown in FIG. 5B, tip end portions of the tape leads 5a and 5b are connected to predetermined electrodes (not shown) of the first semiconductor chip 3a via the bumps 4. Thereafter, the tape leads 5a and 5b are cut to predetermined lengths by punching with a die, and the tape leads 5a and 5b are bent into a shape shown in FIG. 5B.

Figure 5C:
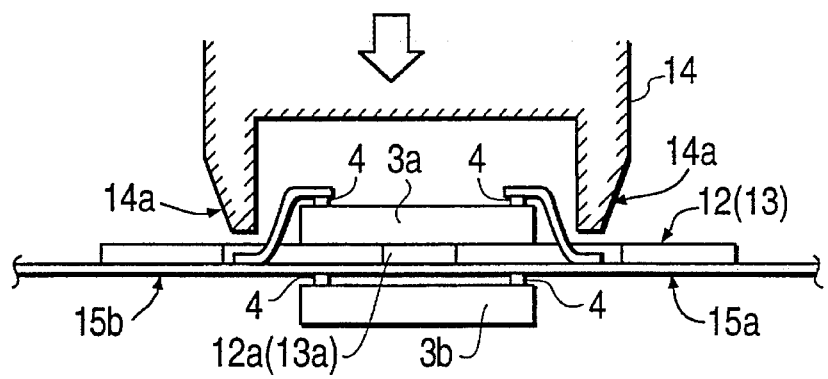

Then, as shown in FIG. 5C, the bent tip end portions of the tape leads 5a and 5b are placed on the respective tape leads 15a and 15b and connected in the following manner.

A generally U-shaped bonding tool 14 is heated to a high temperature of approximately 450° C., and a tip end 14a of this bonding tool 14 presses the top of the tape leads 5a and 5b in contact with the respective tape leads 15a and 15b against the tape leads 15a and 15b. Hence, the tape leads 5a and 5b are bonded on the respective tape leads 15a and 15b by thermo-compression bonding. As described above, the tape leads 5a and 5b are gold plated, and the tape leads 15a and 15b are tin plated. For this reason, eutectic crystal is easily generated as the bonding parts of the tape leads 5a, 5b, 15a and 15b are heated and cooled thereafter. Thus it is therefore possible to make a positive bonding which is inexpensive and sufficient from a practical point of view.

The eutectic crystal occurs more easily if all of the tape leads 5a, 5b, 15a and 15b are gold plated. In this case, an even more positive bonding can be made although it will be more expensive compared to the above. Alternatively, it is also possible to bond the tape leads 5a and 5b to the tape leads 15a and 15b by laser welding.

Figure 5D:
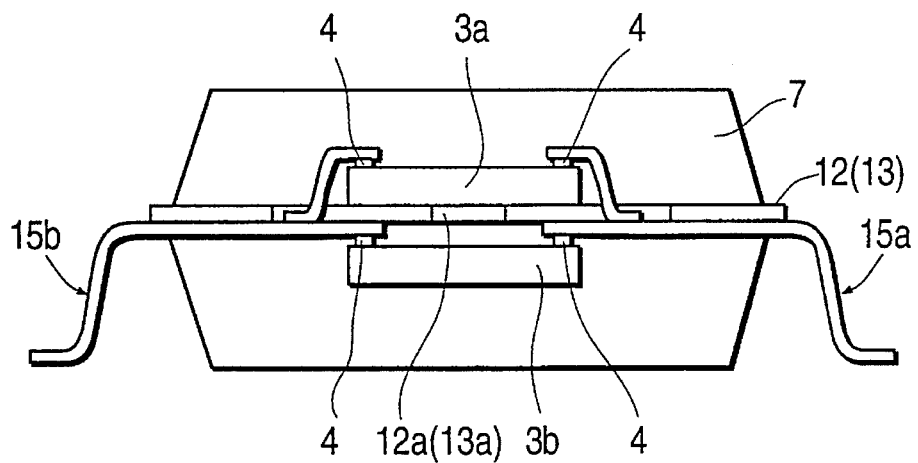

Finally, as shown in FIG. 5D, a transfer molding is carried out similarly to the conventional case so as to encapsulate the first and second semiconductor chips 3a and 3b and their peripheral parts by a mold resin 7 and therefore, form a package. As a result, the semiconductor device 11 shown in FIGS. 3A and 3B or the semiconductor device shown in FIG. 4 is obtained.

According to the first embodiment and its modification, the first semiconductor chip 3a is supported and held by the support member 12 or 13, and the first semiconductor chip 3a is prevented from being displaced by the injection pressure of the mold resin 7 during the transfer molding process. On the other hand, the linear tape leads 15a and 15b may be slightly deformed by the injection pressure of the mold resin 7, thereby causing a slight displacement of the second semiconductor chip 3b. However, the projecting parts 12a of the support member 12 or the bridge part 13a of the support member 13 is interposed between the first and second semiconductor chips 3a and 3b. For this reason, the tape leads 15a and 15b are prevented from making contact with the second surface 3a" of the first semiconductor chip 3a of the edge portion of the first semiconductor chip 3a, thus, an electrical short-circuit will not occur.

Therefore, two semiconductor chips can be arranged within a single package and yet enable reduction in both the size and thickness of the semiconductor device.

Figure 6A:
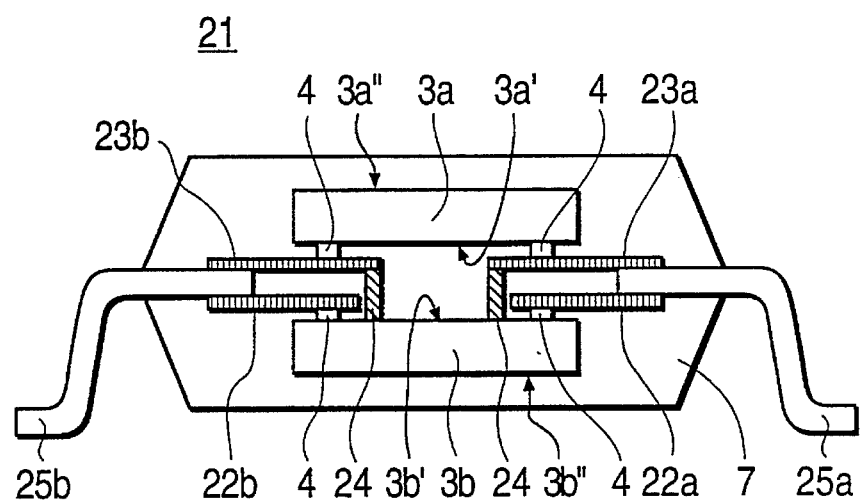
FIGS. 6A and 6B are a cross sectional view and a partial plan view, respectively, showing a second embodiment of the semiconductor device according to the present invention.
Figure 6B:
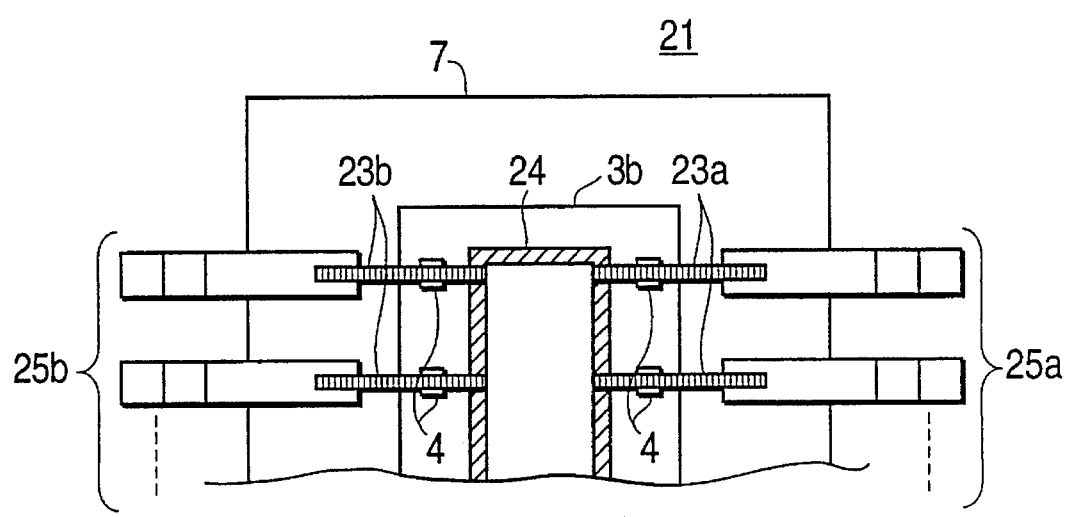

A description will now be given of a second embodiment of the semiconductor device according to the present invention, by referring to FIGS. 6A and 6B. FIG. 6A shows a cross section of the second embodiment, and FIG. 6B shows an opened-up plan view of an essential part of the second embodiment. In FIGS. 6A and 6B, those parts which are the same as those corresponding parts in FIGS. 3A and 3B are designated by the same reference numerals, and a description thereof will be omitted.

According to this embodiment, the first surface 3a' of the first semiconductor chip 3a and the first surface 3b' of the second semiconductor chip 3b confront each other in a semiconductor device 21. In addition, a film 24 which is made of an insulator material is provided between the first and second semiconductor chips 3a and 3b.

In other words, in FIG. 6A, the first surface 3a' of the first semiconductor chip 3a, having the circuits formed thereon, faces down. In addition, tape leads 23a and 23b are connected to a plurality of bumps 4 which are formed at predetermined positions on the first surface 3a' by thermo-compression bonding. The film 24 is fixed to the bottom surfaces of respective ends of the tape leads 23a and 23b under the first semiconductor chip 3a.

As will be described later, the film 24 is formed to a frame shape from a polyimide system resin, for example, as shown in part in FIG. 6B within a device hole of a film carrier. Since the ends of the tape heads 23a and 23b are fixed to this film 24, the tape heads 23a and 23b which are copper films can be protected and handled with ease.

On the other hand, the other ends of the tape leads 23a and 23b are connected to respective lead frames 25a and 25b by thermo-compression bonding, that is, by outer lead bonding. The lead frames 25a and 25b project from the mold resin 7 and are formed into a predetermined shape. The projecting shaped ends of the lead frames 25a and 25b can be electrically connected to an external circuit substrate.

In addition, the ends of tape leads 22a and 22b are connected to the bumps 4 formed at predetermined positions on the first surface 3a' of the first semiconductor chip 3a and to the bumps 4 formed at predetermined positions of the first surface 3b' of the second semiconductor chip by thermo-compression bonding, i.e., by inner lead bonding.

The bottom surface of the film 24 is slightly separated from the first surface 3b' of the second semiconductor chip 3b. However, because the film 24 is made of the insulative polyimide system resin, the bottom surface of the film 24 may make contact with the first surface 3b' of the second semiconductor chip 3b. Furthermore, the other ends of the tape leads 22a and 22b are connected to the lead frames 25a and 25b by thermo-compression bonding, i.e., by outer lead bonding.

Figure 7A:
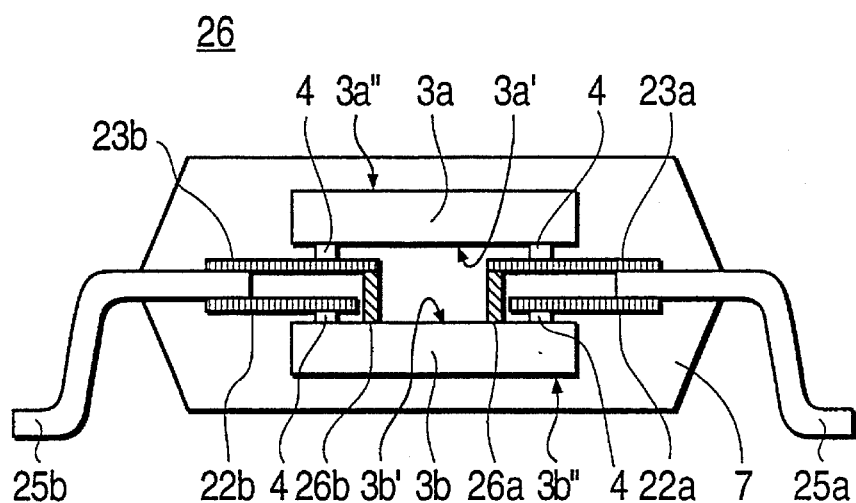
FIGS. 7A and 7B are a cross sectional view and a partial plan view, respectively, showing a modification of the second embodiment.
Figure 7B:
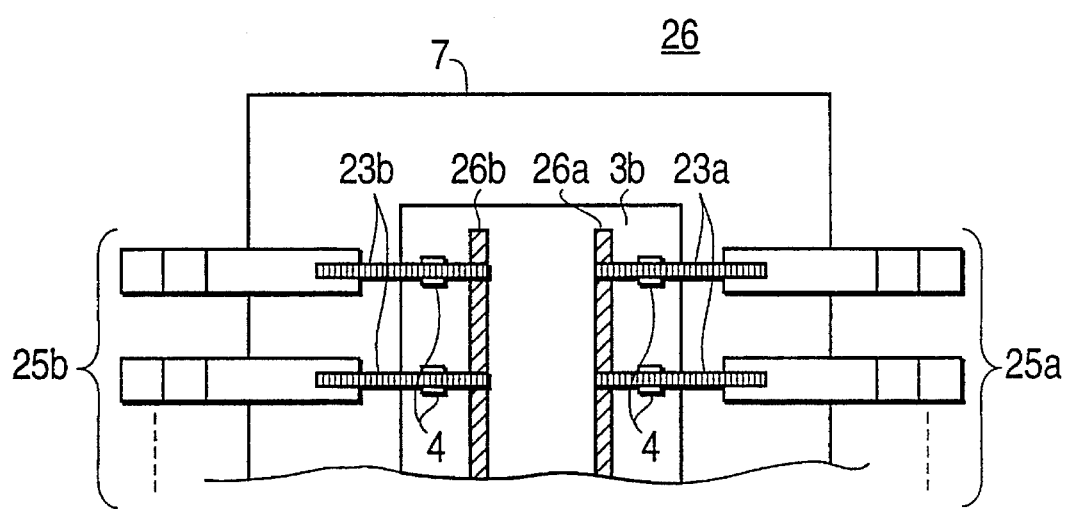

FIGS. 7A and 7B show a modification of the second embodiment. FIG. 7A shows a cross section of this modification, and FIG. 7B shows an opened-up plan view of an essential part of this modification. In FIGS. 7A and 7B, those parts which are the same as those corresponding parts in FIGS. 6A and 6B are designated by the same reference numerals, and a description thereof will be omitted.

In this modification shown in FIGS. 7A and 7B, a semiconductor device 26 uses linear films 26a and 26b in place of the film 24 of the semiconductor device 21 shown in FIGS. 6A and 6B. The film 26a is connected to the bottom surface at one end of each tape lead 23a, and the film 26b is connected to the bottom surface at one end of each tape lead 23b. In other words, the films 26a and 26b are provided in the form of parallel rails.

Next, a general description will be given of a method of producing the semiconductor device 21 shown in FIGS. 6A and 6B or the semiconductor device 26 shown in FIGS. 7A and 7B, by referring to FIGS. 8 through 10. The method described hereunder employs the so-called TAB inner lead bonding.

Figure 9A:
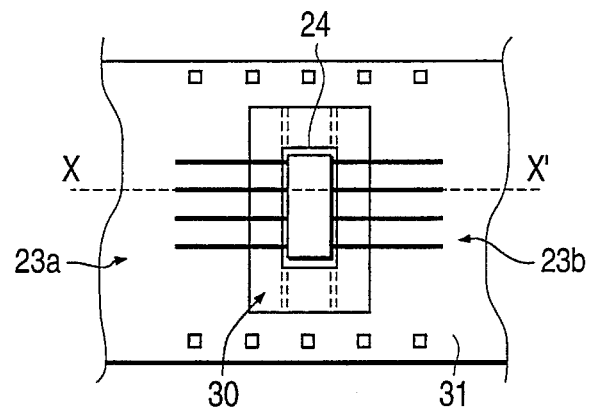
FIGS. 9A through 9D and FIGS. 10A through 10D are diagrams for explaining the method of producing the second embodiment.

FIG. 8 is a flow chart for explaining the production method. FIGS. 9A through 9D and FIGS. 10A through 10D are diagrams for explaining essential steps of this production method. However, although FIG. 9A shows the film 24 which is used to produce the semiconductor device 21 shown in FIGS. 6A and 6B, FIGS. 9B through 9D and FIGS. 10A through 10D show the steps in common for the semiconductor devices 21 and 26.

Figure 9B:
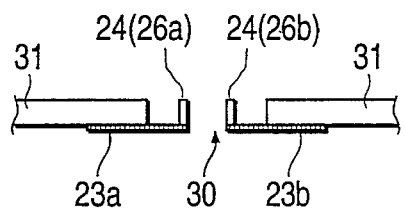
Figure 9C:
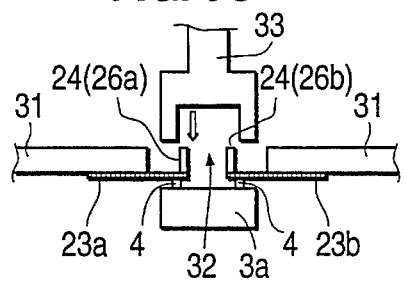
Figure 9D:
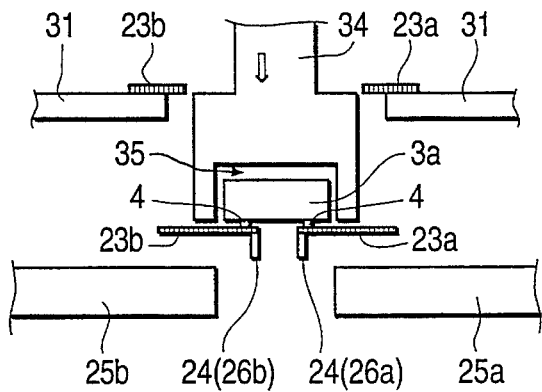

First, a tape carrier 31 shown in FIG. 9A is prepared. This tape carrier 31 has the tape leads 23a and 23b formed thereon, and the tip ends of the tape leads 23a and 23b are fixed to the film 24 within a device hole 30. As indicated by a dotted line, the film 24 is integrally punched out with the film carrier by a die, for example. Thereafter, the tape leads 23a and 23b are printed on the tape carrier 31 and then punched out into the frame shape shown so that a structure shown in FIG. 9B is obtained. FIGS. 9B through 9D respectively show cross sections along a line X—X' in FIG. 9A.

Next, in an inner lead bonding step 101 shown in FIG. 8, a tip end portion of a bonding tool 33 which is heated to a high temperature of 450° C., for example, presses against the tape leads 23a and 23b as indicate by an arrow in FIG. 9C. The tip end portion of this bonding tool 33 has a groove 32 which extends in the direction in which the film 24 (or the films 26a and 26b) are arranged, so that the film 24 (or the films 26a and 26b) is surrounded by the tip end portion of the bonding tool 33. As a result, the tape leads 23a and 23b are compression bonded to the bumps 4 of the first semiconductor chip 3a.

Then, after the first semiconductor chip 3a is bonded to the film carrier 31 via the tape leads 23a and 23b, an outer lead bonding step 102 shown in FIG. 8 is carried out as shown in FIG. 9C. In other words, the film carrier 31 is turned over, and the tape leads 23a and 23b are cut to predetermined lengths by punching out the tape leads 23a and 23b using a die. Hence, the first semiconductor chip 3a and the parts connected thereto are separated from the film carrier 31.

In addition, the tape leads 23a and 23b are placed on top of the ends of the lead frames 25a and 25b, and a tip end portion of a heated bonding tool 34 presses against the cut ends of the tape leads 23a and 23b as indicated by an arrow in FIG. 9D. The tip end portion of this bonding tool 34 has a groove 35 which surrounds the first semiconductor chip 3a. As a result, the tape leads 23a and 23b are bonded to the respective lead frames 25a and 25b.

Figure 10A:
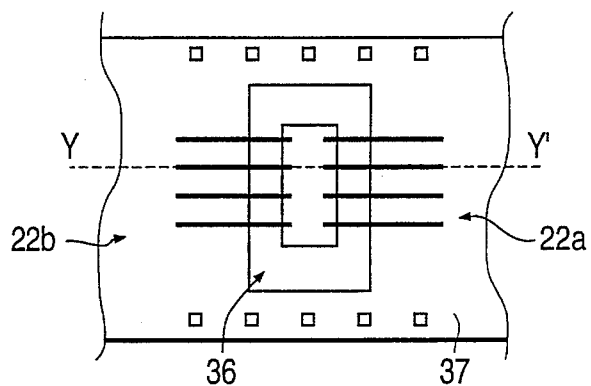
Figure 10B:
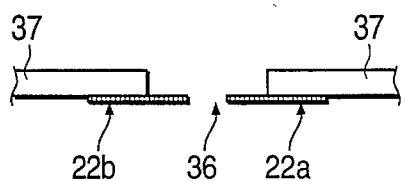
Figure 10C:
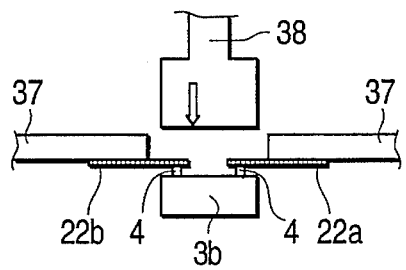
Figure 10D:
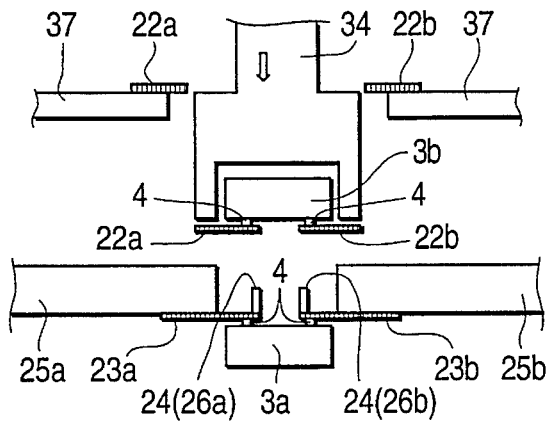

At the same time as the steps 101 and 102 described above, a film carrier 37 shown in FIG. 10A is prepared. This tape carrier 37 has the tape leads 22a and 22b formed thereon, and the tip ends of the tape leads 22a and 22b project within a device hole 36. The tape leads 22a and 22b are printed on the tape carrier 37 and then punched out by a die together with the film carrier 37 within the device hole 36 into the shape shown in FIG. 10B, similarly as in the case described above with reference to FIGS. 9A and 9B. FIGS. 10B through 10D respectively show cross sections along a line Y—Y' in FIG. 10A.

Next, in an inner lead bonding step 103 shown in FIG. 8, a tip end portion of a heated bonding tool 38 presses against the tape leads 22a and 22b as indicated by an arrow in FIG. 10C. As a result, the tape leads 22a and 22b are compression bonded to the bumps 4 of the second semiconductor chip 3b.

Then, after the second semiconductor chip 3b is bonded to the film carrier 37 via the tape leads 22a and 22b, an outer lead bonding step 104 shown in FIG. 8 is carried out as shown in FIG. 10D. In other words, the film carrier 37 is turned over, and the tape leads 22a and 22b are cut to predetermined lengths by punching out the tape leads 22a and 22b using a die. Hence, the second semiconductor chip 3b and the parts connected thereto are separated from the film carrier 37.

In addition, similarly to the case described above in conjunction with FIG. 9D, the lead frames 25a and 25b having the first semiconductor chip 3a bonded thereon via the tape leads 23a and 23b are turned over again, and the tape leads 22a and 22b are placed on top of the ends of the lead frames 25a and 25b. The tip end portion of the heated bonding tool 34 presses against the tape leads 22a and 22b as indicated by an arrow in FIG. 10D. As a result, the tape leads 22a and 22b are bonded to the respective lead frames 25a and 25b.

Next, as shown in FIG. 8, a known transfer molding step 106 is carried out. More particularly, the package is formed to encapsulate the semiconductor chips 3a and 3b by the mold resin 7 in a state where portions of the lead frames 25a and 25b project from a cavity of dies (not shown).

Thereafter, an outer lead plating step 107 shown in FIG. 8 is carried out. For example, the outer leads formed by the lead frames 25a and 25b projecting outside the package are tin-plated by this outer lead plating step 107. In addition, an outer lead shaping step 108 shown in FIG. 8 is carried out. For example, the outer leads formed by the lead frames 25a and 25b projecting outside the package are shaped into an L-shape by this outer lead shaping step 108. As a result, the semiconductor device 21 shown in FIGS. 6A and 6B or the semiconductor device 26 shown in FIGS. 7A and 7B is obtained.

According to the second embodiment and its modification, the insulator film 24 or the insulator films 26a and 26b which is/are fixed to the tape leads 23a and 23b is/are interposed between the first and second semiconductor chips 3 and 3b, and the first and second semiconductor chips 3a and 3b are prevented from being displaced by the injection pressure of the mold resin 7 during the transfer molding process.

In addition, even if one of the tape leads 22a, 22b, 23a and 23b is slightly deformed such that the first semiconductor chip 3a and the second semiconductor chip 3b close upon each other, the film 24 or the films 26a and 26 makes/make contact with the first surface 3b' of the second semiconductor chip 3b and the first and second semiconductor chips 3a and 3b are prevented from further closing upon each other.

For this reason, the tape leads 22a, 22b, 23a and 23b are prevented from making contact with each other, and the first surfaces 3a' of the first semiconductor chip 3a and the first surface 3b' of the second semiconductor chip 3b are prevented from being electrically short-circuited. Therefore, two semiconductor chips 3a and 3b can be arranged within a single package and yet enable reduction in both the size and thickness of the semiconductor device. Furthermore, the second embodiment and its modification have advantages in that the production process will not become complex and the semiconductor device can be produced at a low cost because a part formed within the device hold of the film carrier is used as the insulator material.

The insulator films 24, 26a and 26b do not have to be fixed continuously to all of the tape leads 23a and 23b. In other words, the insulator film may be cut at intermediate parts or may be fixed to only some of the tape leads 22a, 22b, 23a and 23b, as long as the insulator film is interposed between the second semiconductor chip 3b and the tape leads 23a and 23b and is shaped to prevent contact between the tape leads 23a and 23b and the tape leads 22a and 22b even if the tape leads 22a, 22b, 23a and 23b are deformed.

Moreover, it is also possible to provide the insulator film on the side of the tape leads 22a and 22b instead of on the side of the tape leads 23a and 23b.

Figure 11A:
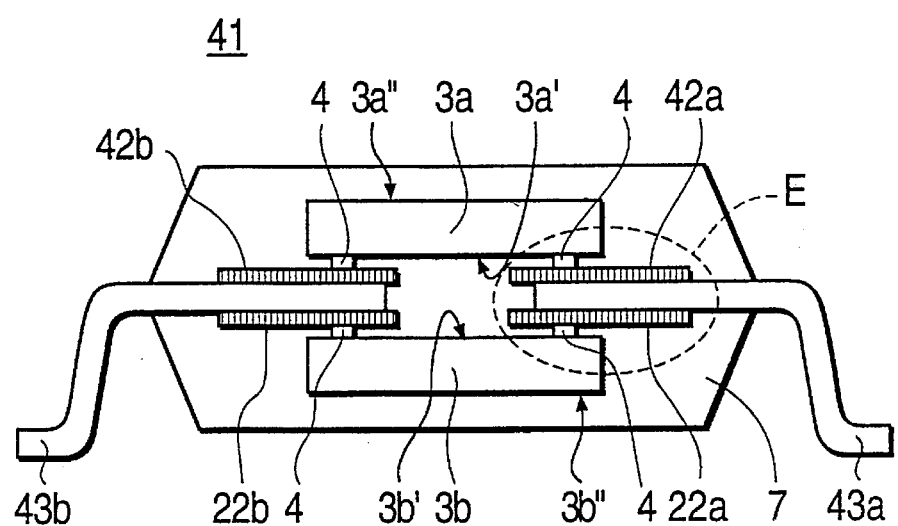
FIGS. 11A and 11B are a cross sectional view and a partial plan view, respectively, showing a third embodiment of the semiconductor device according to the present invention.
Figure 11B:
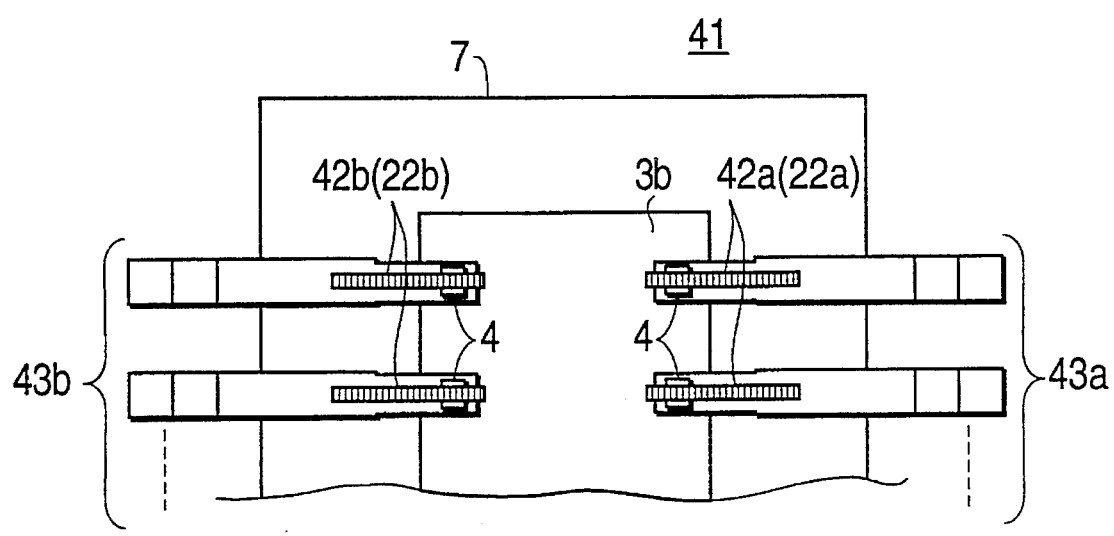
Figure 12:
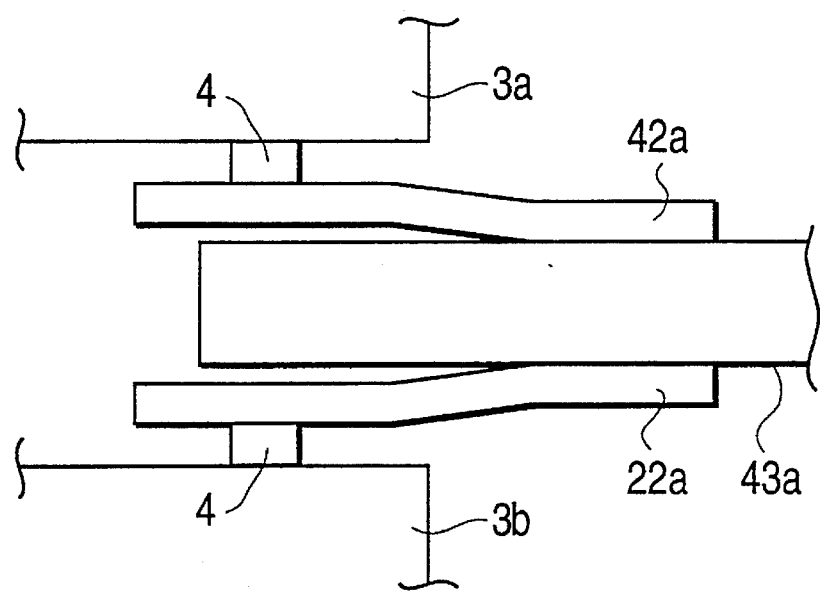
FIG. 12 is a side view showing an essential part of the third embodiment.

Next, a description will be given of a third embodiment of the semiconductor device according to the present invention, by referring to FIGS. 11A, 11B and 12. FIG. 11A shows a cross section of the third embodiment, and FIG. 11B shows an opened-up plan view of an essential part of the third embodiment. In FIGS. 11A and 11B, those parts which are the same as those corresponding parts in FIGS. 6A and 6B are designated by the same reference numerals, and a description thereof will be omitted. FIG. 12 is an enlarged side view showing an essential part of the third embodiment surrounded by a dotted line E in FIG. 11A.

According to this embodiment, the first surfaces 3a' and 3b' of the first and second semiconductor chips 3a and 3b confront each other in a semiconductor device 41, similarly to the semiconductor devices 21 and 26 described above. But in this embodiment, the electrical short-circuit between the semiconductor chips 3a and 3b or the tape leads 22a, 22b, 42a and 42b is prevented without the use of an insulator material.

In other words, in FIGS. 11A and 12, one end of each of the tape leads 22a and 22b is connected to the bumps 4 on the second semiconductor chip 3b by thermo-compression bonding, similarly to the semiconductor devices 21 and 26 shown in FIGS. 6A and 6B and FIGS. 7A and 7B. On the other hand, the other ends of the tape leads 22a and 22b are respectively connected to the bottom surfaces of lead frames 43a and 43b by thermo-compression bonding.

In addition, the tape leads 42a and 42b have approximately the same shapes as the tape leads 22a and 22b. One end of each of the tape leads 42a and 42b is connected to the bumps 4 on the first semiconductor chip 3a by thermo-compression bonding. On the other hand, the other ends of the tape leads 42a and 42b are respectively connected to the top surfaces of the lead frames 43a and 43b by thermo-compression bonding.

As shown on an enlarged scale in FIG. 12, the tip end of the lead frame 43a (and 43b) which is encapsulated by the mold resin 7 extends to a part between the first surfaces 3a' and 3b' of the first and second semiconductor chips 3a and 3b, so that the tip end is interposed between the bumps 4 on the respective first surfaces 3a' and 3b'. In addition, the parts of the tape leads 22a and 42a (and 22b and 42b) which is bonded to the bumps 4 by the thermo-compression bonding are shaped so as to slightly separate from the top and bottom surfaces of the lead frame 43a (and 43b) as shown in FIG. 12.

Figure 13:
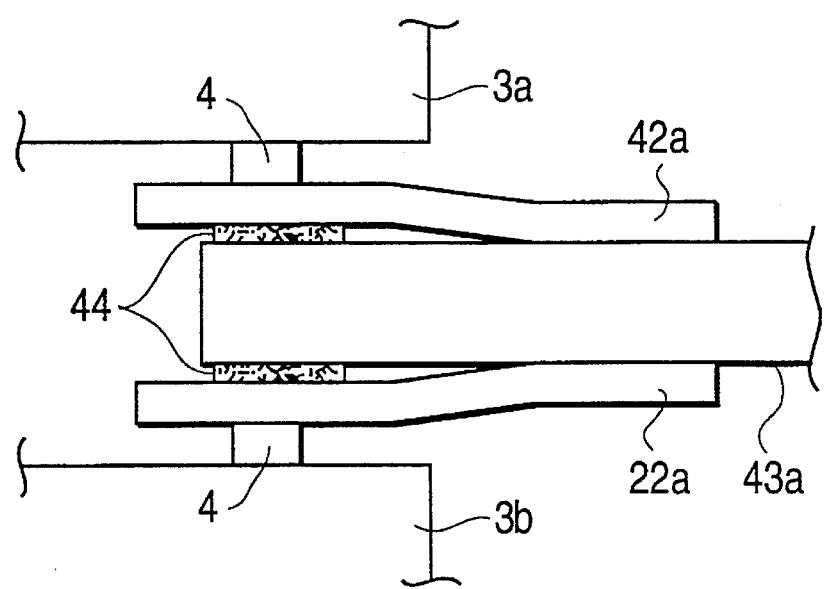
FIG. 13 is a side view showing an essential part of a modification of the third embodiment.

FIG. 13 shows an essential part of a modification of the third embodiment. FIG. 13 is an enlarged side view of a part corresponding to the encircled part E of the third embodiment shown in FIG. 11A.

According to this modification shown in FIG. 13, an adhesive agent 44 is provided between the top surface of the lead frame 43a (and 43b) and the tape lead 22a (and 22b) and between the bottom surface of the lead frame 43a (and 43b) and the tape lead 42a (and 42b). Hence, the positions of the tape leads 22a, 22b, 42a and 42b and the lead frames 43a and 43b are fixed by the adhesive agent 44.

Next, a general description will be given of a method of producing the semiconductor device 41 shown in FIGS. 11A, 11B and 12 or the modification shown in FIG. 13, by referring to FIG. 14. The method described hereunder employs the so-called TAB inner lead bonding.

FIG. 14 is a flow chart for explaining the production method.

First, a tape carrier similar to that described above in conjunction with FIG. 10A and the first semiconductor chip 3a are prepared. This tape carrier has the tape leads 42a and 42b formed thereon, and the tip ends of the tape leads 42a and 42b project within a device hole in the tape carrier.

Next, in an inner lead bonding step 111 shown in FIG. 14, the tip end portion of the heated bonding tool 38 presses against the tape leads 42a and 42b, so as to bond the tape leads 42a and 42b to the bumps 4 on the first semiconductor chip 3a by thermo-compression bonding.

Then, after the first semiconductor chip 3a is bonded to the film carrier via the tape leads 42a and 42b, an outer lead bonding step 112 shown in FIG. 14 is carried out. In other words, the film carrier is turned over, and the tape leads 42a and 42b are cut to predetermined lengths by punching out the tape leads 42a and 42b using a die. Hence, the first semiconductor chip 3a and the parts connected thereto are separated from the film carrier. In addition, the tape leads 42a and 42b are placed on top of the ends of the lead frames 43a and 43b, and a tip end portion of a heated bonding tool presses against the cut ends of the tape leads 42a and 42b. As a result, the tape leads 42a and 42b are bonded to the respective lead frames 43a and 43b by thermo-compression bonding.

At the same time as the steps 111 and 112 described above, a film carrier similar to that described above in conjunction with FIG. 10A is prepared. This tape carrier has the tape leads 22a and 22b formed thereon, and the tip ends of the tape leads 22a and 22b project within a device hole in the film carrier.

Next, in an inner lead bonding step 113 shown in FIG. 14, the tip end portion of the heated bonding tool 38 presses against the tape leads 22a and 22b. As a result, the tape leads 22a and 22b are compression bonded to the bumps 4 of the second semiconductor chip 3b.

Then, after the second semiconductor chip 3b is bonded to the film carrier via the tape leads 22a and 22b. an outer lead bonding step 114 shown in FIG. 14 is carried out. In other words, the film carrier is turned over similarly as described above with reference to FIG. 10D, and the tape leads 22a and 22b are cut to predetermined lengths by punching out the tape leads 22a and 22b using a die. Hence, the second semiconductor chip 3b and the parts connected thereto are separated from the film carrier.

In addition, the lead frames 43a and 43b having the first semiconductor chip 3a bonded thereon via the tape leads 42a and 42b are turned over again, and the tape leads 22a and 22b are placed on top of the ends of the lead frames 43a and 43b. The tip end portion of the heated bonding tool 34 presses against the tape leads 22a and 22b. As a result, the tape leads 22a and 22b are bonded to the respective lead frames 43a and 43b.

By the steps described above, the first and second semiconductor chips 3a and 3b are connected to the lead frames 43a and 43b via the tape leads 42a, 42b, 22a and 22b with a predetermined gap formed therebetween.

Next, in the case of the modification of the third embodiment, an adhesive coating step 115 is carried out to coat the adhesive agent 44 between the lead frame 43a and the tape leads 42a and 22b, and between the lead frame 43b and the tape leads 42b and 22b as shown in FIG. 13, so as to fix the tape leads 42a and 22a to the lead frame 43a and the tape leads 42b and 22b to the lead frame 43b. For example, the adhesive agent 44 may be made of a polyimide system resin, an epoxy system resin, a silicon resin or the like, or any other adhesive agent which has an adhesive characteristic that the adhesive agent 44 is unaffected by the heat which is generated in the following transfer molding step 116. Of course, the adhesive coating step 115 is omitted in the case of the third embodiment.

Then, the transfer molding step 116 shown in FIG. 14 is carried out. More particularly, the package is formed to encapsulate the semiconductor chips 3a and 3b by the mold resin 7 in a state where portions of the lead frames 43a and 43b project from a cavity of dies (not shown).

Thereafter, an outer lead plating step 117 shown in FIG. 14 is carried out. For example, the outer leads formed by the lead frames 43a and 43b projecting outside the package are tin-plated by this outer lead plating step 117. In addition, an outer lead shaping step 118 shown in FIG. 14 is carried out. For example, the outer leads formed by the lead frames 43a and 43b projecting outside the package are shaped into an L-shape by this outer lead shaping step 118. As a result, the semiconductor device 41 shown in FIGS. 11A and 11B or the semiconductor device shown in FIGS. 12 is obtained.

According to this embodiment and its modification, portions of the rigid lead frames 43a and 43b are interposed between the ends (the right and left ends in FIG. 11A, for example) of the first and second semiconductor chips 3a and 3b, together with the tape leads 42a, 42b, 22a and 22b.

For this reason, in FIG. 12, even if the tape leads 42a, 42b, 22a and 22b are displaced in directions such that the semiconductor chips 3a and 3b close upon each other due to the injection pressure of the mold resin 7 during the transfer molding process, the semiconductor chips 3a and 3b are restricted by the thickness of the lead frames 43a and 43b and will not make contact with each other.

On the other hand, in FIG. 13, each of the tape leads 42a, 42b, 22a and 22b are fixed to the corresponding lead frames 43a and 43b. As a result, the semiconductor chips 3a and 3b and the tape leads 42a, 42b, 22a and 22b will not be displaced by the injection pressure of the mold resin 7 during the transfer molding process. In addition, the rigid lead frames 43a and 43b will not be deformed by the injection pressure of the mold resin 7 during the transfer molding process.

Therefore, in this embodiment and its modification, the semiconductor chips 3a and 3b and the tape leads 42a, 42b, 22a and 22b will not make contact with each other, and an electrical short-circuit will not occur.

Hence, according to each of the embodiments and the modifications described above, it is possible to provide two semiconductor chips within a single package of the semiconductor device and improve the chip mounting density, without the possibility of electrically short-circuiting the semiconductor chips and the tape leads. In addition, it is of course possible to encapsulate three or more semiconductor chips within the single package in a manner similar to that described above.

Further, the present invention is not limited to these embodiments, but various variations and modifications may be made without departing from the scope of the present invention.

What is claimed is:

1. A semiconductor device comprising:

a first semiconductor chip and a second semiconductor chip, each of said first and second semiconductor chips having a first surface and a second surface and respective first and second surface areas, the second surface of said first semiconductor chip confronting the first surface of said second semiconductor chip;

a plurality of leads having inner portions and outer portions, said inner portions of said leads being electrically coupled to corresponding, selected surface portions on one of the first and second surfaces of each of said first and second semiconductor chips;

an insulator, having first and second surfaces, interposed between the second surface of said first semiconductor chip and the first surface of said second semiconductor chip at portions other than the corresponding, selected surface portions thereof and so that each respective area of the first and second surfaces of said insulator overlaps said first semiconductor chip and overlaps said second semiconductor chip, and each respective area is smaller than the second surface area of said first semiconductor chip and smaller than the first surface area of said second semiconductor chip; and a resin package encapsulating said first and second semiconductor chips so that the outer portions of said leads project outside said resin package, said resin package including resin between the second surface of the first semiconductor chip and the first surface of the second semiconductor chip.

2. The semiconductor device as claimed in claim 1, wherein the inner portions of said leads are electrically coupled to the first surfaces of said first and second semiconductor chips.

3. The semiconductor device as claimed in claim 2, wherein said first and second semiconductor chips have circuits formed on the first surfaces thereof.

4. The semiconductor device as claimed in claim 1, wherein the inner portions of said leads are electrically coupled to the second surface of said first semiconductor chip and to the first surface of said second semiconductor chip.

5. The semiconductor device as claimed in claim 4, wherein said first semiconductor chip has circuits formed on the second surface thereof, and said second semiconductor chip has circuits formed on the first surface thereof.

6. The semiconductor device as claimed in claim 4, wherein said insulator makes contact with at least the inner portions of said leads which are electrically coupled to the second surface of said first semiconductor chip.

7. The semiconductor device as claimed in claim 4, wherein said insulator makes contact with the first surface of said second semiconductor chip at portions other than the corresponding, selected surface portions.

8. The semiconductor device as claimed in claim 1, wherein said insulator prevents direct contact between the second surface of said first semiconductor chip and the first surface of said second semiconductor chip.

9. The semiconductor device as claimed in claim 1, wherein said insulator prevents the inner portions of said leads from being electrically coupled to one of the first and second surfaces of each of said first and second semiconductor chips at portions other than the corresponding, selected surface portions.

10. The semiconductor device as claimed in claim 1, wherein the inner portions of said leads include first tape leads which are electrically coupled to said first semiconductor chip, second tape leads which are electrically coupled to said second semiconductor chip, and lead frames at least partially interposed between the first and second tape leads and having ends which project from said resin package to 11. A semiconductor device comprising:

a first semiconductor chip and a second semiconductor chip, each of said first and second semiconductor chips having a first surface and a second surface, the second surface of said first semiconductor chip confronting the first surface of said second semiconductor chip;

a plurality of leads having inner portions and outer portions, said inner portions of said leads being electrically coupled to corresponding, selected surface portions on one of the first and second surfaces of each of said first and second semiconductor chips; and a resin package encapsulating said first and second semiconductor chips so that the outer portions of said leads project outside said resin package, said inner portions of said leads being partially interposed between the second surface of said first semiconductor chip and the first surface of said second semiconductor chip so that a predetermined gap is formed between the second surface of said first semiconductor chip and the first surface of said second semiconductor chip;

said inner portions of said leads including:
first tape leads which are electrically coupled to the corresponding selected surface portions on the second surface of said first semiconductor chip;
second tape leads which are electrically coupled to the corresponding selected surface portions on the first surface of said second semiconductor chip; and
lead frames at least partially interposed between the first and second tape leads and having ends which project from said resin package to form the outer portions.

12. The semiconductor device as claimed in claim 11, wherein the inner portions of said leads are electrically coupled to the second surface of said first semiconductor chip and to the first surface of said second semiconductor chip.

13. The semiconductor device as claimed in claim 12, wherein said first semiconductor chip has circuits formed on the second surface thereof, and said second semiconductor chip has circuits formed on the first surface thereof.

14. The semiconductor device as claimed in claim 11, wherein each of said first and second tape leads has a respective first end which is connected to a corresponding one of the lead frames, a respective second end which is electrically coupled to a corresponding semiconductor chip of said first and second semiconductor chips, and a respective curved part between the respective first and second ends.

15. The semiconductor device as claimed in claim 14, wherein a resin forming said resin package fills a gap between the second end of each of said first and second tape leads and a corresponding lead frame of the lead frames.

16. The semiconductor device as claimed in claim 14, which further comprises an adhesive agent filling a gap between the second end of each of said first and second tape leads and a corresponding lead frame of the lead frames.

17. The semiconductor device as claimed in claim 11, wherein each of said first tape leads has a tip end which makes contact with the second surface of said first semiconductor chip.

\* \* \* \* \*

UNITED STATES PATENT AND TRADEMARK OFFICE
CERTIFICATE OF CORRECTION

PATENT NO. : 5,479,051
DATED : Dec. 26, 1995
INVENTOR(S) : WAKI et al.

It is certified that error appears in the above-indentified patent and that said Letters Patent is hereby corrected as shown below:

TITLE PAGE: [75] Inventors:

After the first inventor's name, change the city "Kagoshima" to --Satsuma--.

Col. 1, line 9, change "having the a" to --having a--.

Col. 3, line 18, after "BRIEF DESCRIPTION" insert --OF--.

Col. 5, line 27, after "Thus" insert --,--;
line 57, before "thus," insert --and--.

Col. 6, line 21, change "heads" to --leads--;
line 22, change "heads" to --leads--.

Col. 7, line 22, change "indicate" to --indicated--.

Col. 8, line 4, change "in addition," to --In addition,--.

Col. 10, line 37, change "22b." to --22b,--.

Col. 12, line 58 (claim 10, line 7), after "package to" insert --form the outer portions.--.

Signed and Sealed this

Twenty-eighth Day of May, 1996

Attest:

BRUCE LEHMAN

*Attesting Officer*  *Commissioner of Patents and Trademarks*